(12) United States Patent
Ito

(10) Patent No.: US 10,103,346 B2
(45) Date of Patent: Oct. 16, 2018

(54) ORGANIC LIGHT EMITTING DIODE DISPLAY DEVICE AND MANUFACTURING METHOD THEREOF

(71) Applicant: Samsung Display Co., Ltd., Yongin-si, Gyeonggi-do (KR)

(72) Inventor: Naoyuki Ito, Seongnam-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 15/722,543

(22) Filed: Oct. 2, 2017

(65) Prior Publication Data

US 2018/0108858 A1    Apr. 19, 2018

(30) Foreign Application Priority Data

Oct. 13, 2016   (KR) .................. 10-2016-0132899

(51) Int. Cl.
*H01L 51/50* (2006.01)
*H01L 51/00* (2006.01)

(52) U.S. Cl.
CPC ...... *H01L 51/5056* (2013.01); *H01L 51/0052* (2013.01); *H01L 51/0059* (2013.01); *H01L 2251/558* (2013.01)

(58) Field of Classification Search
None
See application file for complete search history.

(56) References Cited

U.S. PATENT DOCUMENTS

| 8,535,974 | B2 | 9/2013 | Brown et al. | |
| 9,196,856 | B2* | 11/2015 | Qiu | H01L 51/0058 |
| 9,896,621 | B2* | 2/2018 | Kim | C09K 11/025 |
| 9,966,534 | B2* | 5/2018 | Stackhouse | H01L 51/0035 |
| 2011/0266531 | A1* | 11/2011 | Kim | H01L 51/005 257/40 |
| 2014/0353652 | A1* | 12/2014 | Pegington | C07C 211/61 257/40 |
| 2016/0111674 | A1 | 4/2016 | Bae et al. | |
| 2016/0190507 | A1* | 6/2016 | Doust | H01L 51/0039 257/40 |
| 2016/0211452 | A1* | 7/2016 | Kakimoto | C09K 11/06 |
| 2016/0301005 | A1 | 10/2016 | Pfister et al. | |
| 2017/0098770 | A1* | 4/2017 | Humphries | H01L 51/0043 |

FOREIGN PATENT DOCUMENTS

| KR | 10-2013-0043169 A | 5/2016 |
| KR | 10-2016-0060170 A | 5/2016 |
| KR | 10-2016-0078506 A | 7/2016 |
| WO | 01/39554 A1 | 5/2001 |

* cited by examiner

*Primary Examiner* — Walter H. Swanson
*Assistant Examiner* — Kien Ly
(74) *Attorney, Agent, or Firm* — Innovation Counsel LLP

(57) ABSTRACT

An organic light emitting diode display device includes: a substrate; a first electrode on the substrate; a hole transport layer on the first electrode; an organic light emitting layer on the hole transport layer; and a second electrode on the organic light emitting layer. The hole transport layer includes a hole transport layer composition including a compound represented by Chemical Formula 1, a compound represented by Chemical Formula 2, a compound represented by Chemical Formula 3, and a compound represented by Chemical Formula 4.

12 Claims, 8 Drawing Sheets

ORGANIC LIGHT EMITTING DIODE DISPLAY DEVICE AND MANUFACTURING METHOD THEREOF

CROSS-REFERENCE TO RELATED APPLICATION

This application claims priority under 35 U.S.C. § 119 to Korean Patent Application No. 10-2016-0132899, filed on Oct. 13, 2016, in the Korean Intellectual Property Office (KIPO), the disclosure of which is incorporated by reference herein in its entirety.

1. Technical Field

Embodiments relate to an organic light emitting diode ("OLED") display device and a method of manufacturing the OLED display device.

2. Discussion of Related Art

An OLED display device is a self-luminous display device that displays an image using an OLED that emits light. Such OLED display devices are currently garnering attention because they have high quality characteristics such as low power consumption, high luminance, and high reaction speed.

The OLED display devices have a multilayer structure including an OLED. Due to such a multilayer structure, a light emitted from the OLED is extinguished in the process of being emitted to the outside, resulting in a low luminous efficiency of the OLED display device. Accordingly, it is necessary to increase luminous efficiency of the OLED display device.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Exemplary embodiments may be directed to an OLED display device having excellent luminous efficiency and a long lifetime, and a method of manufacturing the OLED display device.

According to an exemplary embodiment, an organic light emitting diode display device includes: a substrate; a first electrode on the substrate; a hole transport layer on the first electrode; an organic light emitting layer on the hole transport layer; and a second electrode on the organic light emitting layer. The hole transport layer includes a hole transport layer composition including a compound represented by the following Chemical Formula 1, a compound represented by the following Chemical Formula 2, a compound represented by the following Chemical Formula 3, and a compound represented by the following Chemical Formula 4.

[Chemical Formula 1]

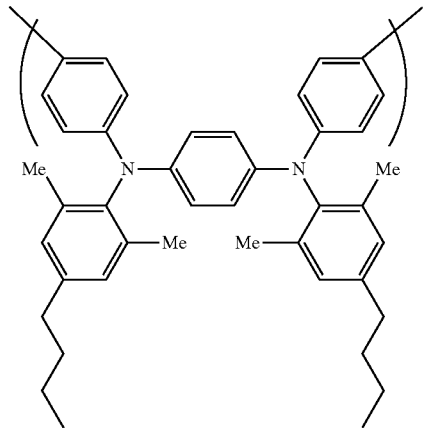

[Chemical Formula 2]

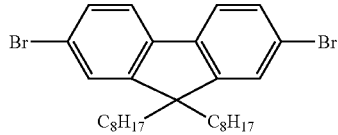

[Chemical Formula 3]

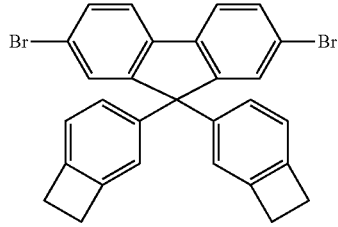

[Chemical Formula 4]

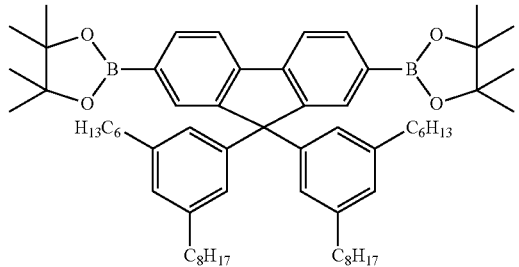

The hole transport layer may be formed by coating and curing the hole transport layer composition.

The hole transport layer composition may include the compound represented by Chemical Formula 1 in an amount ranging from about 25 percent by weight (wt %) to about 35 wt %, the compound represented by Chemical Formula 2 in an amount ranging from about 10 wt % to about 15 wt %, the compound represented by Chemical Formula 3 in an amount ranging from about 5 wt % to about 10 wt %, and the compound represented by Chemical Formula 4 in an amount ranging from about 40 wt % to about 60 wt %.

The hole transport layer may have a refractive index of about 1.6 or less.

The hole transport layer may have a thickness ranging from about 5 nm to about 10 nm.

The hole transport layer may have a thickness ranging from about 100 nm to about 110 nm.

The organic light emitting layer may be formed by depositing an organic light emitting material.

The organic light emitting diode display device may further include a hole injection layer between the first electrode and the hole transport layer.

The hole injection layer may be formed by coating and curing a solution including a hole injecting material.

The hole injection layer may have a refractive index of about 1.6 or less.

The organic light emitting diode display device may further include an electron transport layer between the organic light emitting layer and the second electrode.

The first electrode may include a reflective layer and a light transmissive conductive layer on the reflective layer, and the following Equation 2 may be satisfied when an optical distance between a surface of the reflective layer opposing the second electrode and a surface of the second electrode opposing the reflective layer is L1 and a peak wavelength of a light generated in the organic emitting layer is λ1, $$L1=[(2m+1)/4]\times\lambda 1,  \qquad \text{[Equation 2]}$$

wherein m is an integer greater than or equal to zero.

According to another exemplary embodiment, a method of manufacturing an organic light emitting diode display device includes: forming a first electrode on a substrate; coating and curing a hole transport layer composition to form a hole transport layer on the first electrode; depositing an organic light emitting material to form an organic light emitting layer on the hole transport layer; and forming a second electrode on the organic light emitting layer. The hole transport layer composition includes a compound represented by Chemical Formula 1, a compound represented by Chemical Formula 2, a compound represented by Chemical Formula 3, and a compound represented by Chemical Formula 4.

The hole transport layer composition may include the compound represented by Chemical Formula 1 in an amount ranging from about 25 wt % to about 35 wt %, the compound represented by Chemical Formula 2 in an amount ranging from about 10 wt % to about 15 wt %, the compound represented by Chemical Formula 3 in an amount ranging from about 5 wt % to about 10 wt %, and the compound represented by Chemical Formula 4 in an amount ranging from about 40 wt % to about 60 wt %.

The method may further include, after forming the first electrode and before forming the hole transport layer, forming a hole injection layer on the first electrode, using a solution including a hole injecting material.

The foregoing is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

A more complete appreciation of the inventive concept will become more apparent by describing in detail exemplary embodiments thereof with reference to the accompanying drawings, wherein.

DETAILED DESCRIPTION

Figure 1:
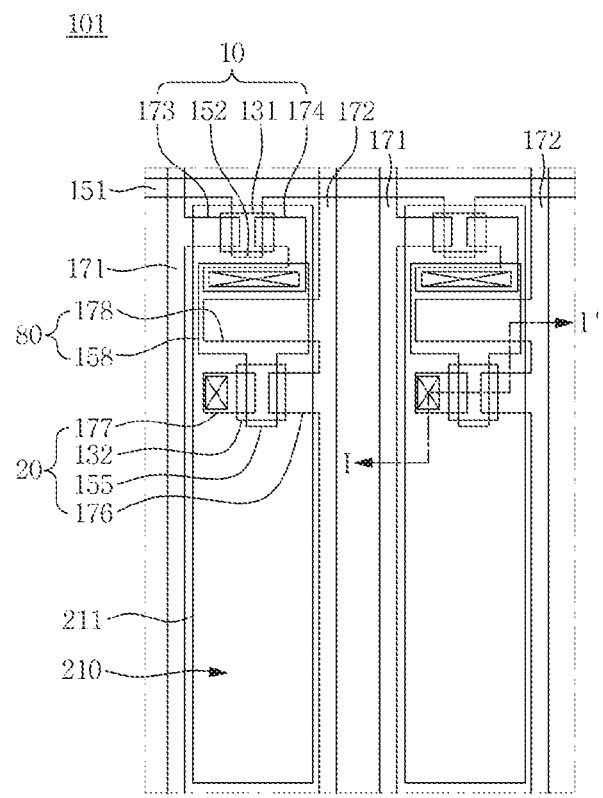
FIG. 1 is a plan view illustrating an OLED display device according to an exemplary embodiment.

Exemplary embodiments will now be described more fully hereinafter with reference to the accompanying drawings. Although the inventive concept may be modified in various manners and have several exemplary embodiments, exemplary embodiments are illustrated in the accompanying drawings and will be mainly described in the specification. However, the scope of the inventive concept is not limited to the exemplary embodiments and should be construed as including all the changes, equivalents, and substitutions included in the spirit and scope of the inventive concept.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "lower", "above", "upper", and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction, and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the present specification.

Some of the parts which are not associated with the description may not be provided in order to specifically describe exemplary embodiments, and like reference numerals refer to like elements throughout the specification.

Hereinafter, an exemplary embodiment will be described with reference to FIGS. 1, 2 and 3.

Figure 2:
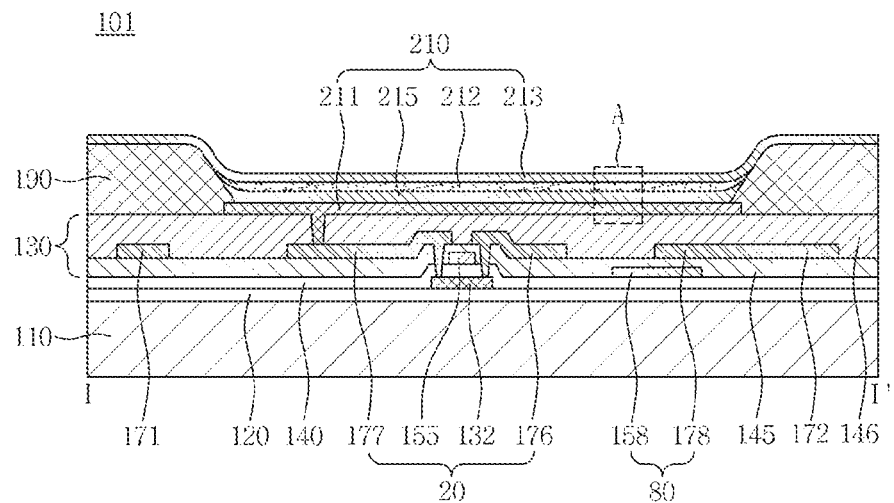
FIG. 2 is a cross-sectional view taken along line I-I' of FIG. 1.
Figure 3:
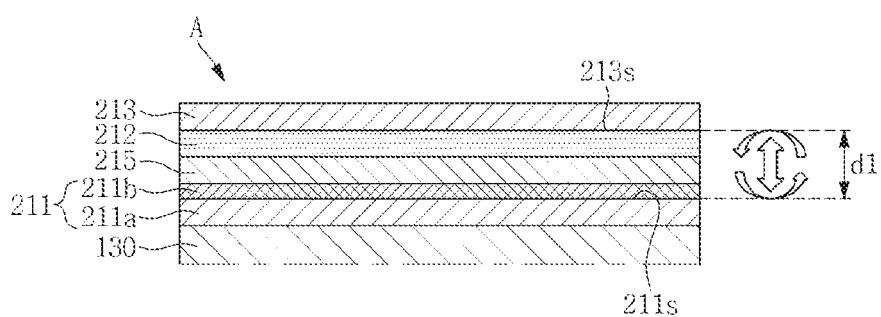
FIG. 3 is an enlarged view illustrating a portion A of FIG. 2.

FIG. 1 is a plan view illustrating an OLED display device 101 according to an exemplary embodiment, FIG. 2 is a cross-sectional view taken along line I-I' of FIG. 1, and FIG. 3 is an enlarged view illustrating a portion A of FIG. 2.

Referring to FIGS. 1 and 2, the OLED display device 101 according to an exemplary embodiment includes a substrate 110, a wiring unit 130, and an OLED 210.

The substrate 110 may include an insulating material selected from the group consisting of: glass, quartz, ceramic, plastic, or the like. However, exemplary embodiments are not limited thereto, and the substrate 110 may include a metallic material such as stainless steel.

A buffer layer 120 is disposed on the substrate 110. The buffer layer 120 may include one or more layers selected from various inorganic layers and organic layers. The buffer layer 120 serves to substantially prevent permeation of undesirable elements, e.g., impurity elements or moisture, into the wiring unit 130 or the OLED 210, and to planarize a surface therebelow. However, the buffer layer 120 is not invariably necessary and may be omitted.

The wiring unit 130 is disposed on the buffer layer 120. The wiring unit 130 is a part including a switching thin film transistor ("TFT") 10, a driving TFT 20 and a capacitor 80, and drives the OLED 210. The OLED 210 emits light according to a driving signal received from the wiring unit 130 to display an image.

FIGS. 1 and 2 illustrate an active matrix-type organic light emitting diode (AMOLED) display device 101 having a 2Tr-1Cap structure. For example, the 2Tr-1Cap structure may include two TFTs, e.g., the switching TFT 10 and the driving TFT 20, and one capacitor 80 in each pixel, but exemplary embodiments are not limited thereto. For example, the OLED display device 101 may include three or more TFTs and two or more capacitors in each pixel, and may further include additional wirings. Herein, the term "pixel" refers to a smallest unit for displaying an image, and the OLED display device 101 displays an image using a plurality of pixels.

Each pixel includes the switching TFT 10, the driving TFT 20, the capacitor 80, and the OLED 210. In addition, a gate line 151 extending along one direction, and a data line 171 and a common power line 172 insulated from and intersecting the gate line 151 are also included in the wiring unit 130. Each pixel may be defined by the gate line 151, the data line 171 and the common power line 172 as a boundary, but exemplary embodiments are not limited thereto. The pixels may be defined by a pixel defining layer 190.

The capacitor 80 includes a pair of capacitor plates 158 and 178, having an insulating interlayer 145 interposed therebetween. In such an exemplary embodiment, the insulating interlayer 145 may be a dielectric element. A capacitance of the capacitor 80 is determined by electric charges accumulated in the capacitor 80 and a voltage across the pair of capacitor plates 158 and 178.

The switching TFT 10 includes a switching semiconductor layer 131, a switching gate electrode 152, a switching source electrode 173 and a switching drain electrode 174. The driving TFT 20 includes a driving semiconductor layer 132, a driving gate electrode 155, a driving source electrode 176 and a driving drain electrode 177. A gate insulating layer 140 is further provided to insulate the semiconductor layers 131 and 132 and the gate electrodes 152 and 155.

The switching TFT 10 may function as a switching element which selects a pixel to perform light emission. The switching gate electrode 152 is connected to the gate line 151, and the switching source electrode 173 is connected to the data line 171. Spaced apart from the switching source electrode 173, the switching drain electrode 174 is connected to one of the capacitor plates, e.g., the capacitor plate 158.

The driving TFT 20 applies a driving power, which allows an organic light emitting layer 212 of the OLED 210 in a selected pixel to emit light, to a first electrode 211. The driving gate electrode 155 is connected to the capacitor plate 158 that is connected to the switching drain electrode 174. Each of the driving source electrode 176 and the other of the capacitor plates, e.g., the capacitor plate 178, is connected to the common power line 172. The driving drain electrode 177 is connected to the first electrode 211 of the OLED 210 through a contact hole.

The switching TFT 10 is driven based on a gate voltage applied to the gate line 151 and serves to transmit a data voltage applied to the data line 171 to the driving TFT 20. A voltage equivalent to a difference between a common voltage applied to the driving TFT 20 from the common power line 172 and the data voltage transmitted by (or from) the switching TFT 10 is stored in the capacitor 80, and a current corresponding to the voltage stored in the capacitor 80 flows to the OLED 210 through the driving TFT 20 such that the OLED 210 may emit light.

A planarization layer 146 is disposed on the insulating interlayer 145. The planarization layer 146 includes an insulating material, and protects the wiring unit 130.

The OLED 210 is disposed on the planarization layer 146. The OLED 210 includes the first electrode 211, a hole transport layer 215 on the first electrode 211, the organic light emitting layer 212 on the hole transport layer 215, and a second electrode 213 on the organic light emitting layer 212. Holes and electrons are injected into the organic light emitting layer 212 from the first electrode 211 and the second electrode 213, respectively, and combined therein to form an exciton. Light is emitted when the exciton falls from an excited state to a ground state.

In an exemplary embodiment, the first electrode 211 is an anode for injecting holes, and the second electrode 213 is a cathode for injecting electrons.

According to an exemplary embodiment, the first electrode 211 includes a reflective layer 211a and the second electrode 213 includes a semi-transmissive layer (see FIG. 3). Accordingly, a light generated in the organic light emitting layer 212 is emitted through the second electrode 213. That is, the OLED display device 101 according to an exemplary embodiment has a top emission type structure.

Referring to FIG. 3, the first electrode 211 may have a structure in which, for example, the reflective layer 211a and a light transmissive conductive layer 211b are stacked. In such an exemplary embodiment, the light transmissive conductive layer 211b of the first electrode 211 is disposed between the reflective layer 211a and the hole transport layer 215 (see FIGS. 3, 7 and 9A).

The reflective layer 211a may include one or more metals selected from: magnesium (Mg), silver (Ag), gold (Au), calcium (Ca), lithium (Li), chromium (Cr), copper (Cu) and aluminum (Al). The reflective layer 211a may have a thickness of about 100 nm or more.

The light transmissive conductive layer 211b may include a transparent conductive oxide (TCO). Examples of the TCO may include: indium tin oxide (ITO), indium zinc oxide (IZO), zinc oxide (ZnO), aluminum zinc oxide (AZO) or indium oxide ($In_2O_3$). Since such a light transmissive conductive layer 211b has a high work function, hole injection through the first electrode 211 is smooth.

In addition, the first electrode 211 may have a triple-layer structure in which a light transmissive conductive layer, a reflective layer and a light transmissive conductive layer are sequentially stacked.

The pixel defining layer 190 serves to separate the plurality of first electrodes 211 from each other. The pixel defining layer 190 has an opening 195 (see FIG. 9B). The opening 195 of the pixel defining layer 190 extends to and exposes a portion of the first electrode 211. The hole transport layer 215, the organic light emitting layer 212 and the second electrode 213 are sequentially stacked on a portion of the first electrode 211 exposed by the opening 195.

Referring to FIG. 2, the hole transport layer 215 is disposed on the first electrode 211. However, exemplary embodiments are not limited thereto, and the hole transport layer 215 may be disposed on the pixel defining layer 190 as well as on the first electrode 211.

According to an exemplary embodiment, the hole transport layer 215 may be formed using a compound represented by the following Chemical Formula 1, a compound represented by the following Chemical Formula 2, a compound represented by the following Chemical Formula 3, and a compound represented by the following Chemical Formula 4.

[Chemical Formula 1]

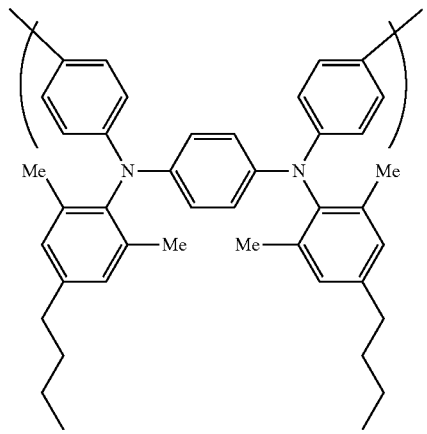

[Chemical Formula 2]

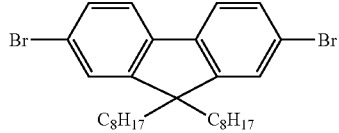

[Chemical Formula 3]

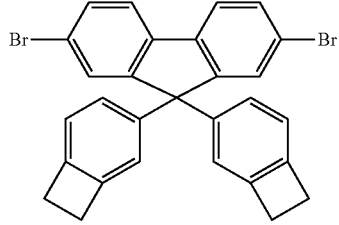

[Chemical Formula 4]

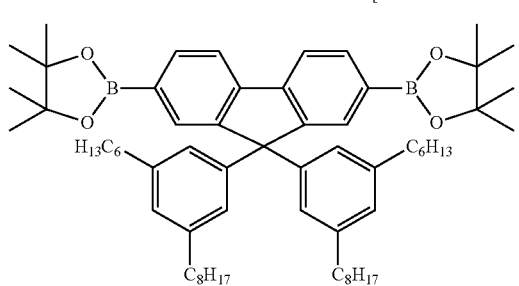

That is, the hole transport layer 215 may include the compound represented by Chemical Formula 1, the compound represented by Chemical Formula 2, the compound represented by Chemical Formula 3, and the compound represented by Chemical Formula 4. For example, the hole transport layer 215 may be formed by coating and curing a composition forming a hole transport layer, sometimes called a hole transport layer composition, including the compound represented by Chemical Formula 1, the compound represented by Chemical Formula 2, the compound represented by Chemical Formula 3, and the compound represented by Chemical Formula 4.

The composition forming a hole transport layer may include the compound represented by Chemical Formula 1 in an amount ranging from about 25 percent by weight (wt %) to about 35 wt %, the compound represented by Chemical Formula 2 in an amount ranging from about 10 wt % to about 15 wt %, the compound represented by Chemical Formula 3 in an amount ranging from about 5 wt % to about 10 wt %, and the compound represented by Chemical Formula 4 in an amount ranging from about 40 wt % to about 60 wt %.

The composition forming the hole transport layer may be in a solution state. A method of forming a layer using a solution is referred to as "a solution method" or "a wet method." According to an exemplary embodiment, the hole transport layer 215 may be formed by the solution method.

Since the composition forming a hole transport layer is in a solution state, one surface of the hole transport layer 215 contacting the organic light emitting layer 212 may become flat even though particles or impurities exist below the hole transport layer 215. Accordingly, luminous efficiency of the organic light emitting layer 212 may be improved and the lifetime may increase.

For example, in the case where a patterning residue generated in the process of forming the first electrode 211 is attached to a surface of the first electrode 211, or a residue or particles generated in the process of forming another layer remains above the first electrode 211, surface unevenness and layer damage may be caused. The surface unevenness may cause defective light emission in the organic light emitting layer 212, and the lifetime of the OLED 210 may be shortened.

However, according to an exemplary embodiment, since the hole transport layer 215 is formed by the solution method, even though a lower surface of the hole transport layer 215 is uneven, an upper surface of the hole transport layer 215 contacting the organic light emitting layer 212 may become planarized. Accordingly, defective light emission may be substantially prevented in the organic light emitting layer 212, and the lifetime of the OLED 210 may be prolonged.

The organic light emitting layer 212 is disposed on the hole transport layer 215. The organic light emitting layer 212 overlaps the first electrode 211.

The organic light emitting layer 212 may include a unimolecular organic material or a polymer organic material. According to an exemplary embodiment, the organic light emitting layer 212 may include a host and a luminescent dopant. The host and the luminescent dopant constituting the organic light emitting layer 212 are referred to as an organic light emitting material.

The organic light emitting layer 212 may be formed by depositing the organic light emitting material. For example, the organic light emitting layer 212 may be formed by deposition of a host and a luminescent dopant.

The second electrode 213 is disposed on the organic light emitting layer 212. Referring to FIG. 2, the second electrode 213 is disposed on the pixel defining layer 190 as well as on the organic light emitting layer 212.

The second electrode 213 may include a semi-transmissive layer including one or more metals selected from the group consisting of magnesium (Mg), silver (Ag), gold (Au), calcium (Ca), lithium (Li), chromium (Cr), copper (Cu) and aluminum (Al). In general, the semi-transmissive layer may have a thickness less than about 200 nm. As the thickness of the semi-transmissive layer becomes thinner, the transmittance of light becomes higher, and as the thickness thereof becomes thicker, the transmittance of light becomes lower.

According to an exemplary embodiment, the second electrode 213 includes magnesium (Mg) and silver (Ag), and the content of silver (Ag) is larger than the content of magnesium (Mg).

Hereinafter, resonance of the OLED display device 101 will be described with reference to FIG. 3.

Referring to FIG. 3, the first electrode 211 includes the reflective layer 211a and the light transmissive conductive layer 211b on the reflective layer 211a.

The OLED display device 101 has a multi-layered structure, and a light generated in the organic light emitting layer 212 is emitted through the multi-layered structure.

When light repeats reflection between two reflective surfaces, optical resonance may occur. When optical resonance occurs, light energy increases and the light having the increased energy may relatively easily pass through the multilayer stack structure to be emitted outwards. Such a structure allowing light resonance between two reflective layers is referred to as a resonance structure and a distance between the two reflective layers between which resonance occurs is referred to as a resonance distance. The resonance distance varies based on the wavelength of light.

According to exemplary embodiment, an upper surface 211s of the reflective layer 211a and a lower surface 213s of the second electrode 213 that oppose each other with the organic light emitting layer 212 therebetween may become reflective surfaces.

When a peak wavelength of a light emitted from the organic light emitting layer 212 is denoted as "λ1," an optical distance between the upper surface 211s of the reflective layer 211a and the lower surface 213s of the second electrode 213 is denoted as "L1," and a phase shift generated when a light generated in the organic light emitting layer 212 is reflected between the upper surface 211s of the reflective layer 211a and the lower surface 213s of the second electrode 213 is denoted as "Φ radian," the optical distance L1 may be set to be a positive minimum value in a range satisfying the following Equation 1.

$$(2L1)/\lambda 1 + \Phi/(2\pi) = m \quad (m \text{ being an integer}) \quad \text{[Equation 1]}$$

In addition, when a peak wavelength of a light emitted from the organic light emitting layer 212 is denoted as "λ1" and an optical distance between the upper surface 211s of the reflective layer 211a and the lower surface 213s of the second electrode 213 is denoted as "L1," The optical distance L1 may be adjusted to satisfy the following Equation 2 for resonance.

$$L1 = [(2m+1)/4] \times \lambda 1, \quad \text{[Equation 2]}$$

In Equation 2, m is an integer of 0 or more.

In addition, the optical distance L1 may be obtained by the following equation 3.

$$L1 = d1 \times n1 \quad \text{[Equation 3]}$$

In Equation 3, "d1" designates a distance between the upper surface 211s of the reflective layer 211a and the lower surface 213s of the second electrode 213, and "n1" designates an average refractive index between the upper surface 211s of the reflective layer 211a and the lower surface 213s of the second electrode 213.

In the case where the hole transport layer 215 has a relatively low refractive index, the resonance distance may be ensured even though the hole transport layer 215 has a large thickness. According to an exemplary embodiment, the hole transport layer 215 may have a refractive index of about 1.6 or less. The hole transport layer 215 may have a low refractive index ranging from about 1.4 to about 1.6, for example. Accordingly, the hole transport layer 215 may have a relatively large thickness.

In the case where the thickness of the hole transport layer 215 is large, the surface smoothness of the hole transport layer 215 may be improved. Accordingly, the luminous efficiency of the organic light emitting layer 212 may be improved.

For example, the hole transport layer 215 may have a thickness ranging from about 5 nm to about 10 nm. In addition, the hole transport layer 215 may have a thickness ranging from about 100 nm to about 110 nm. In the case where the hole transport layer 215 has a thickness ranging from about 5 nm to about 10 nm, a primary resonance of the light generated in the organic light emitting layer 212 may be induced. In the case where the hole transport layer 215 has a thickness ranging from about 100 nm to about 110 nm, a secondary resonance of the light generated in the organic light emitting layer 212 may be induced.

Figure 4:
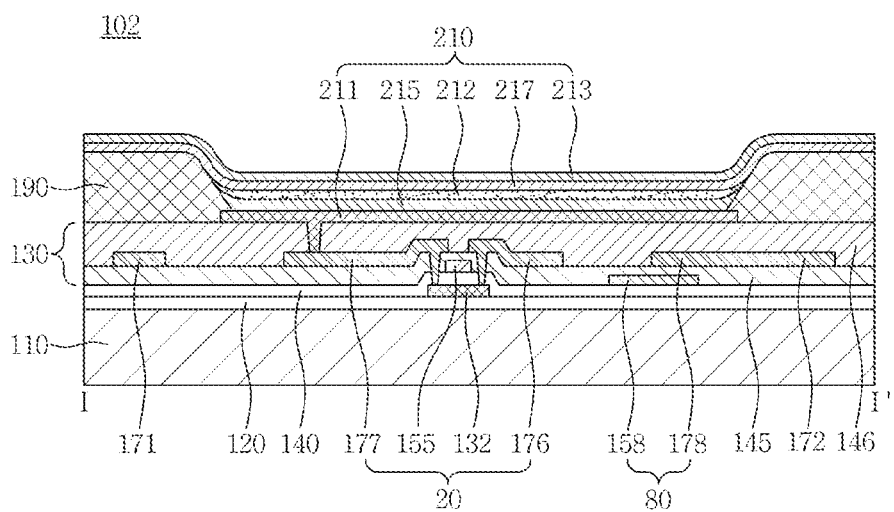
FIG. 4 is a cross-sectional view illustrating an OLED display device according to an alternative exemplary embodiment.

FIG. 4 is a cross-sectional view illustrating an OLED display device 102 according to an alternative exemplary embodiment. Hereinafter, in order to avoid redundancy, descriptions of the components already described will be omitted.

The OLED display device 102 according to an alternative exemplary embodiment includes an electron transport layer (ETL) 217 between an organic light emitting layer 212 and a second electrode 213.

The electron transport layer 217 may be formed by deposition of at least one of a compound represented by the following Chemical Formula 5 and a compound represented by the following Chemical Formula 6.

[Chemical Formula 5]

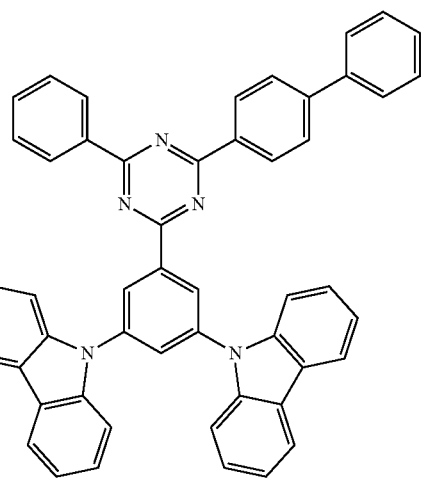

[Chemical Formula 6]

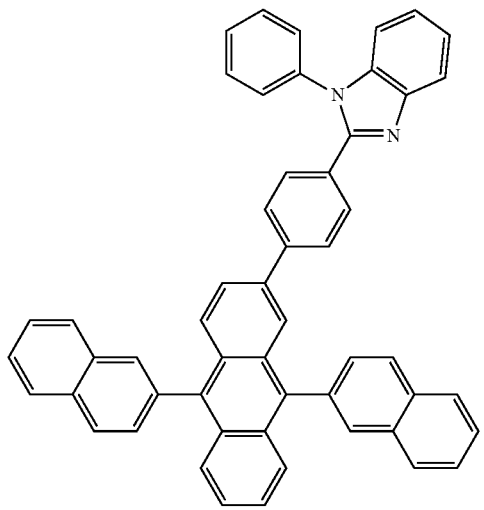

Although not illustrated in FIG. 4, an electron injection layer (EIL) may be disposed on the electron transport layer 217.

Figure 5:
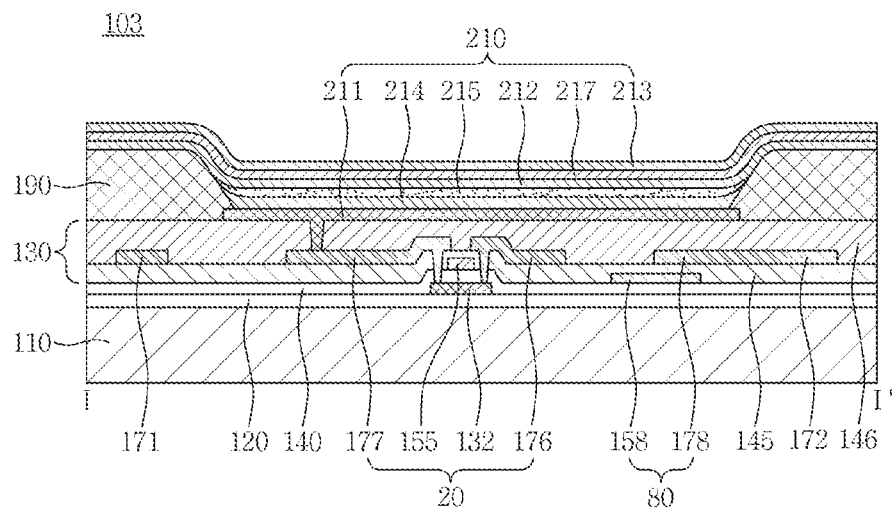
FIG. 5 is a cross-sectional view illustrating an OLED display device according to another alternative exemplary embodiment.

FIG. 5 is a cross-sectional view illustrating an OLED display device 103 according to another alternative exemplary embodiment.

The OLED display device 103 according to another alternative exemplary embodiment includes a hole injection layer (HIL) 214 between a first electrode 211 and a hole transport layer 215.

The hole injection layer 214 may be formed by the solution method, similar to the hole transport layer 215. For example, a PEDOT/PSS solution may be coated on the first electrode 211 and then cured to form the hole injection layer 214. Such a hole injection layer 214 may have a refractive index of about 1.5 and a thickness of about 12 nm.

Referring to FIG. 5, the hole injection layer 214 is disposed on the first electrode 211. However, exemplary embodiments are not limited thereto, and the hole injection layer 214 may be disposed on the pixel defining layer 190 as well as on the first electrode 211.

Figure 6:
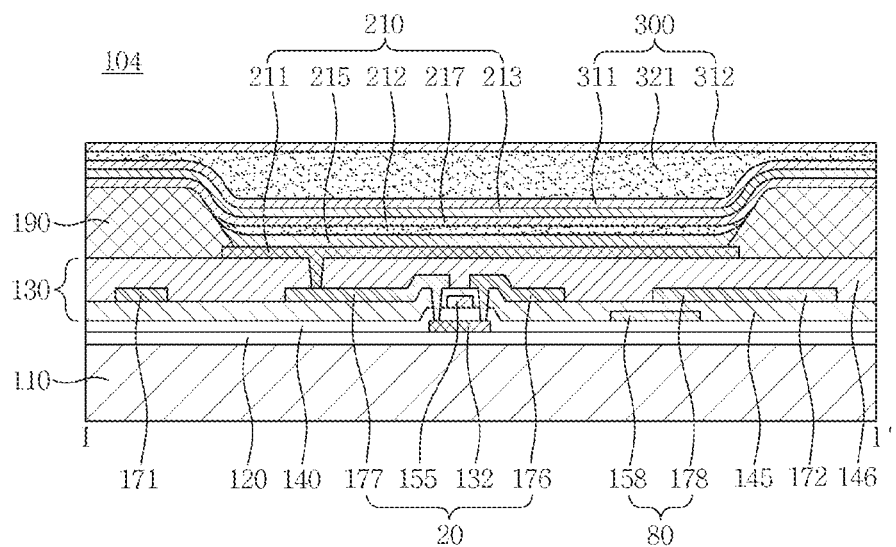
FIG. 6 is a cross-sectional view illustrating an OLED display device according to still another alternative exemplary embodiment.

FIG. 6 is a cross-sectional view illustrating an OLED display device 104 according to still another alternative exemplary embodiment.

Referring to FIG. 6, a thin film encapsulation layer 300 is disposed on a second electrode 213. The thin film encapsulation layer 300 substantially prevents outside air such as moisture or oxygen from penetrating into an OLED 210.

The thin film encapsulation layer 300 includes at least one inorganic layer 311 and 312 and at least one organic layer 321 that are alternately disposed.

The thin film encapsulation layer 300 illustrated in FIG. 6 includes two inorganic layers 311 and 312 and one organic layer 321. However, the structure of the thin film encapsulation layer 300 is not limited to the structure illustrated in FIG. 6.

The inorganic layers 311 and 312 may include at least one selected from the group consisting of: metal oxide, metal oxynitride, silicon oxide, silicon nitride, and silicon oxynitride.

The inorganic layers 311 and 312 may be formed through methods such as a chemical vapor deposition (CVD) method or an atomic layer deposition (ALD) method. However, exemplary embodiments are not limited thereto and the inorganic layers 311 and 312 may be formed through various methods known to those skilled in the art.

The organic layer 321 may include, for example, a polymer-based material.

The organic layer 321 may be formed through a thermal deposition process. The thermal deposition process for forming the organic layer 321 may be performed in a temperature range that may not damage the OLED 210. However, exemplary embodiments are not limited thereto and the organic layer 321 may be formed through various methods known to those skilled in the pertinent art.

The inorganic layers 311 and 312 which have a high density of a thin layer may substantially prevent or efficiently reduce infiltration of, mostly, moisture or oxygen. Permeation of moisture and oxygen into the OLED 210 may be largely prevented by the inorganic layers 311 and 312.

Moisture and oxygen that have passed through the inorganic layers 311 and 312 may further be blocked by the organic layer 321. The organic layer 321 may also serve as a buffer layer to reduce stress between respective ones of the inorganic layers 311 and 312 therebetween, in addition to the moisture permeation preventing function. Further, since the organic layer 321 has planarization characteristics, an uppermost surface of the thin film encapsulation layer 300 may be planarized by the organic layer 321.

The thin film encapsulation layer 300 may have a thickness of about 50 µm or less, e.g., about 10 µm or less where necessary. Accordingly, the OLED display device 104 may have a significantly small thickness. As such, the OLED display device 104 may have flexible characteristics.

However, exemplary embodiments are not limited thereto. In order to protect the OLED 210, an encapsulation substrate (not illustrated) may be disposed on the OLED 210, instead of the thin film encapsulation layer 300. The encapsulation substrate may include of a transparent insulating material such as glass, quartz, ceramic, and plastic. The encapsulation substrate is sealingly attached to the substrate 110 to protect the OLED 210.

In addition, a filler (not illustrated) may be disposed between the OLED 210 and the encapsulation substrate. The filler may include an organic material, for example, a polymer. In addition, a protective layer or an encapsulation layer including a metal or an inorganic material may be disposed on the OLED 210 to protect the OLED 210.

Figure 7:
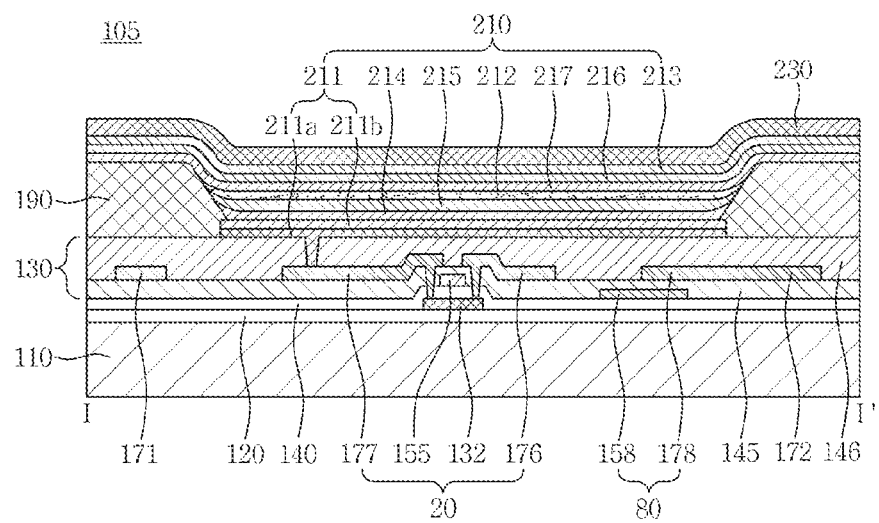
FIG. 7 is a cross-sectional view illustrating an OLED display device according to yet another alternative exemplary embodiment.

FIG. 7 is a cross-sectional view illustrating an OLED display device 105 according to yet another alternative exemplary embodiment.

A first electrode 211 of the OLED display device 105 illustrated in FIG. 7 includes a reflective layer 211a and a light transmissive conductive layer 211b. The reflective layer 211a may include one or more metals selected from: magnesium (Mg), silver (Ag), gold (Au), calcium (Ca), lithium (Li), chromium (Cr), copper (Cu) and aluminum (Al). The light transmissive conductive layer 211b may include a transparent conductive oxide (TCO). Examples of the TCO may include: indium tin oxide (ITO), indium zinc oxide (IZO), zinc oxide (ZnO), aluminum zinc oxide (AZO) or indium oxide ($In_2O_3$).

The OLED display device 105 illustrated in FIG. 7 includes a hole injection layer (HIL) 214 between the first electrode 211 and the hole transport layer 215. The hole injection layer 214 may be formed using a PEDOT/PSS solution.

In addition, the OLED display device 105 illustrated in FIG. 7 includes an electron transport layer (ETL) 217 on the organic light emitting layer 212 and an electron injection layer 216 on the electron transport layer 217.

The electron transport layer 217 may be formed by deposition of at least one of the compound represented by Chemical Formula 5 and the compound represented by Chemical Formula 6. The electron injection layer 216 may be formed by deposition of lithium quinolate (Liq).

In addition, referring to FIG. 7, a capping layer 230 is disposed on the second electrode 213. The capping layer 230 protects the OLED 210 and helps a light emitted from the organic light emitting layer 212 to be efficiently emitted to the outside. The capping layer 230 may include at least one of an inorganic material and an organic material having light transmittance.

Figure 8:
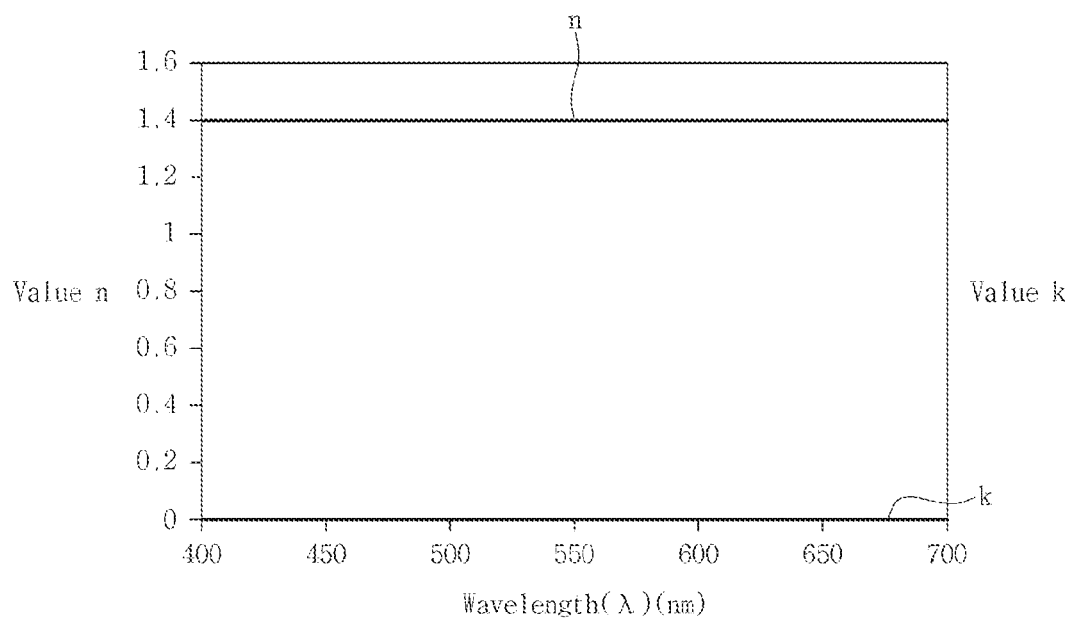
FIG. 8 is a graph illustrating a refractive index and an extinction coefficient of a hole transport layer.

FIG. 8 is a graph illustrating a refractive index and an extinction coefficient of the hole transport layer 215.

For example, FIG. 8 shows measurement results of a refractive index n and an extinction coefficient k of the hole transport layer 215 including a composition forming a hole transport layer that includes the compound represented by Chemical Formula 1, the compound represented by Chemical Formula 2, the compound represented by Chemical Formula 3, and the compound represented by Chemical Formula 4. In such a case, the refractive index was measured according to the wavelength of light.

Referring to FIG. 8, the hole transport layer 215 has a refractive index n of about 1.4 with respect to a light having a wavelength range of visible light, and has an extinction coefficient k of about 0.

Hereinafter, a method of manufacturing OLED display device 105 according to yet another alternative exemplary embodiment will be described with reference to FIGS. 9A, 9B, 9C, 9D, 9E, 9F, 9G, 9H and 9I.

For example, FIGS. 9A, 9B, 9C, 9D, 9E, 9F, 9G, 9H and 9I are cross-sectional views illustrating a process of manufacturing the OLED display device 105 according to yet another alternative exemplary embodiment.

Figure 9A:
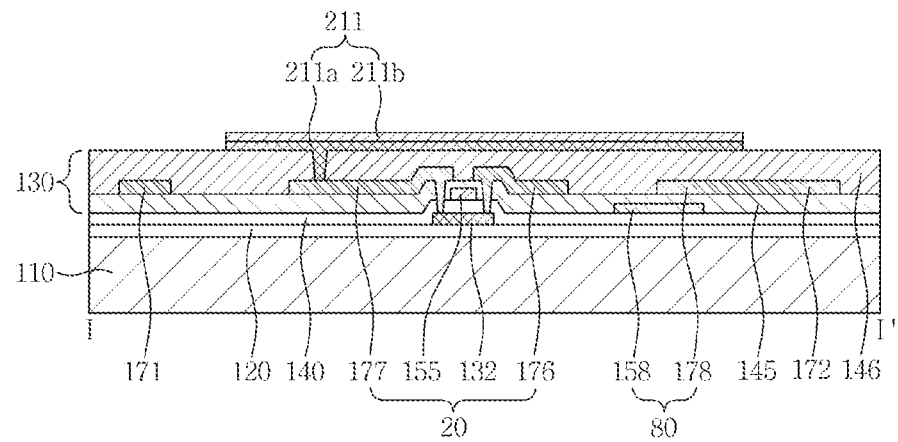
FIGS. 9A, 9B, 9C, 9D, 9E, 9F, 9G, 9H and 9I are cross-sectional views illustrating a process of manufacturing the OLED display device according to yet another alternative exemplary embodiment.

Referring to FIG. 9A, a first electrode 211 is formed on a substrate 110. For example, a buffer layer 120 and a wiring unit 130 are formed on the substrate 110, and the first electrode 211 is formed thereon. The first electrode 211 is connected to a driving thin film transistor 20 disposed at the wiring unit 130.

The first electrode 211 includes a reflective layer 211a and a light transmissive conductive layer 211b.

Figure 9B:
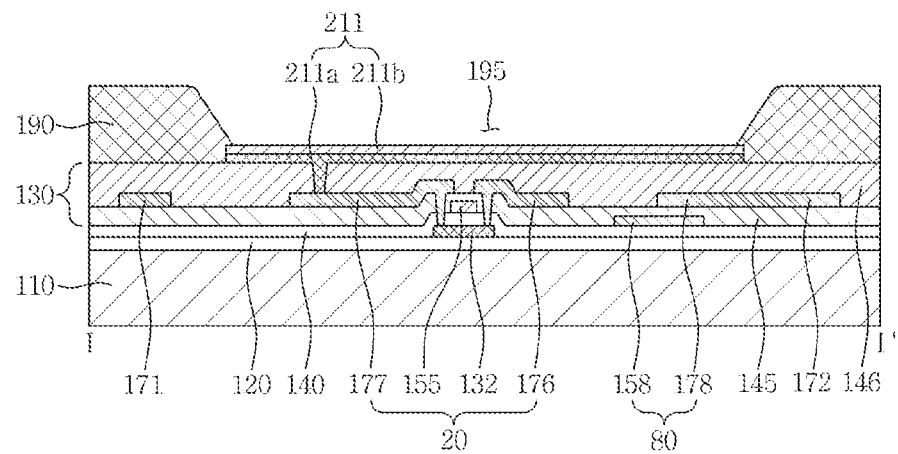

Referring to FIG. 9B, a pixel defining layer 190 is formed on the substrate 110.

The pixel defining layer 190 serves to separate the plurality of first electrodes 211 from each other. The pixel defining layer 190 has an opening 195. The opening 195 of the pixel defining layer 190 exposes a portion of the first electrode 211.

Figure 9C:
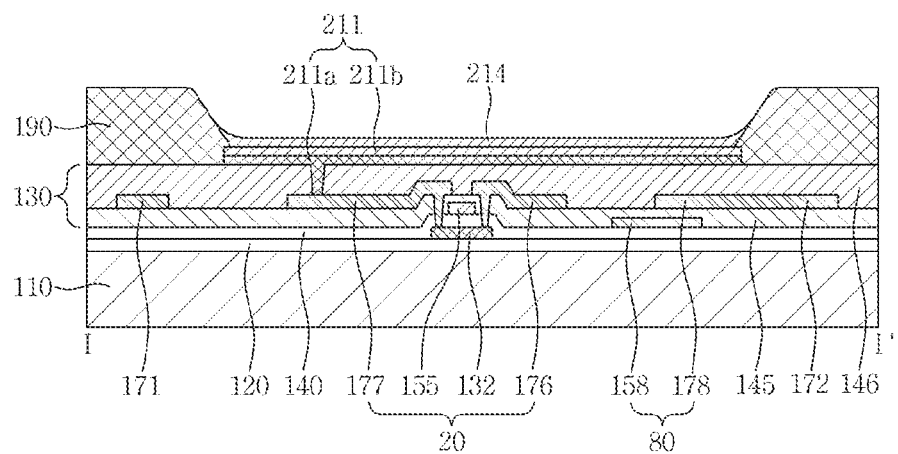

Referring to FIG. 9C, a hole injection layer 214 is formed on the first electrode 211 and the pixel defining layer 190. The hole injection layer 214 may be disposed only on the first electrode 211.

The hole injection layer 214 may be formed using a PEDOT[Poly(3,4-ethylenedioxythiophene)]/PSS[Polystyrene sulfonate] solution. Examples of the PEDOT/PSS solution may include an aqueous solution (with a solvent including PEDOT in an amount of about 0.5 wt % and PSS in an amount of about 0.8 wt %.

The hole injection layer 214 may have a refractive index of about 1.5 and a thickness of about 12 nm.

Figure 9D:
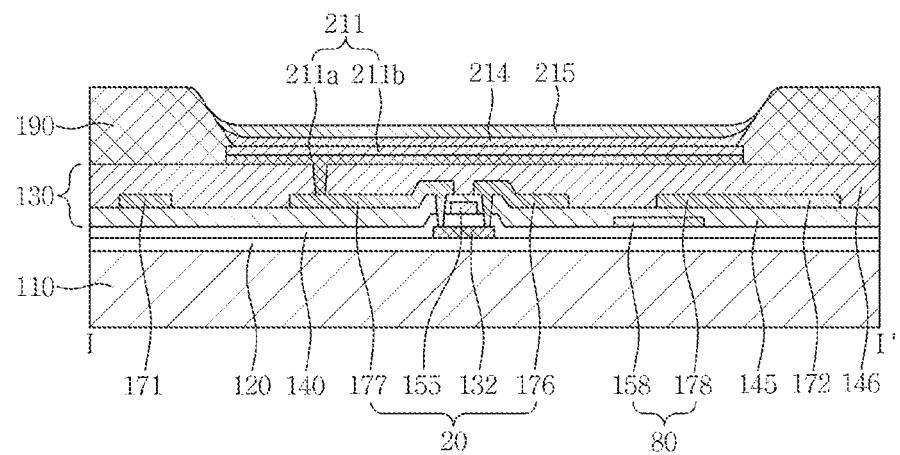

Referring to FIG. 9D, a hole transport layer 215 is formed on the hole injection layer 214.

A composition forming a hole transport layer may be coated on the hole injection layer 214 and cured to form the hole transport layer 215.

The composition forming a hole transport layer includes the compound represented by Chemical Formula 1, the compound represented by Chemical Formula 2, the compound represented by Chemical Formula 3, and the compound represented by Chemical Formula 4. For example, the composition forming a hole transport layer may include the compound represented by Chemical Formula 1 in an amount ranging from about 25 wt % to about 35 wt %, the compound represented by Chemical Formula 2 in an amount ranging from about 10 wt %, to about 15 wt %, the compound represented by Chemical Formula 3 in an amount ranging from about 5 wt % to about 10 wt %, and the compound represented by Chemical Formula 4 in an amount anging from about 40 wt % to about 60 wt %.

Figure 9E:
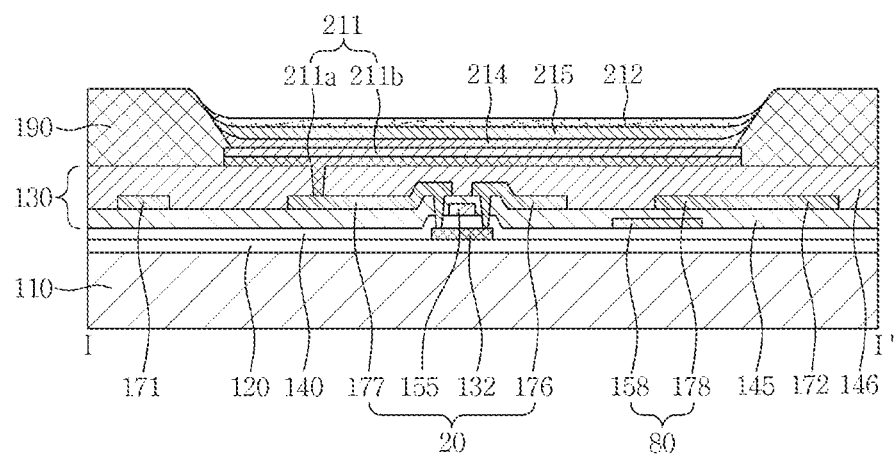

Referring to FIG. 9E, an organic light emitting layer 212 is formed on the hole transport layer 215. The organic light emitting layer 212 overlaps the first electrode 211.

The organic light emitting layer 212 is formed by deposition of an organic light emitting material. That is, the organic light emitting layer 2 is formed by deposition of a host and a luminescent dopant material.

Figure 9F:
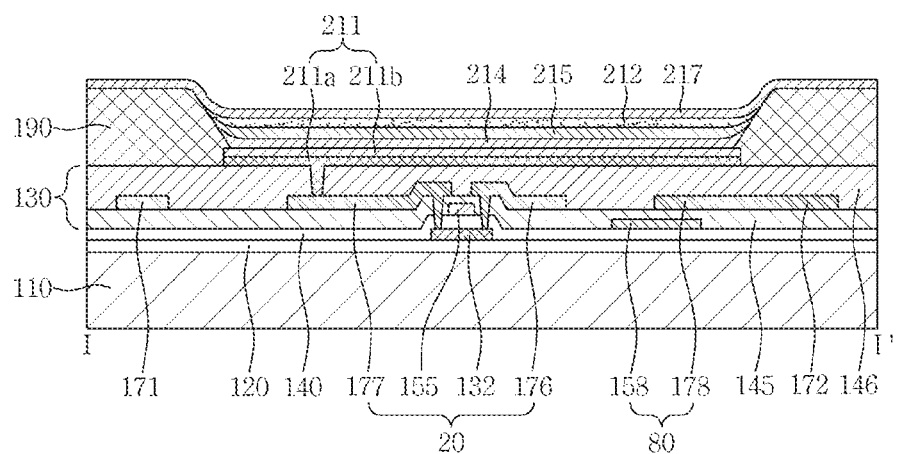

Referring to FIG. 9F, an electron transport layer 217 is formed on the organic light emitting layer 212.

The electron transport layer 217 may be formed by deposition of at least one of the compound represented by Chemical Formula 5 and the compound represented by Chemical Formula 6.

Figure 9G:
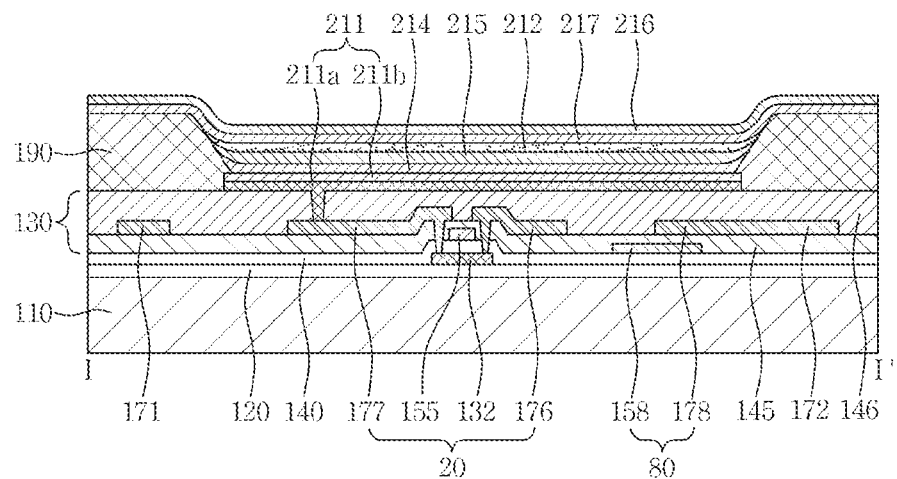

Referring to FIG. 9G, an electron injection layer 216 is formed on the electron transport layer 217.

Lithium quinolate (Liq) may be deposited on the electron transport layer 217 to form the electron injection layer 216.

Figure 9H:
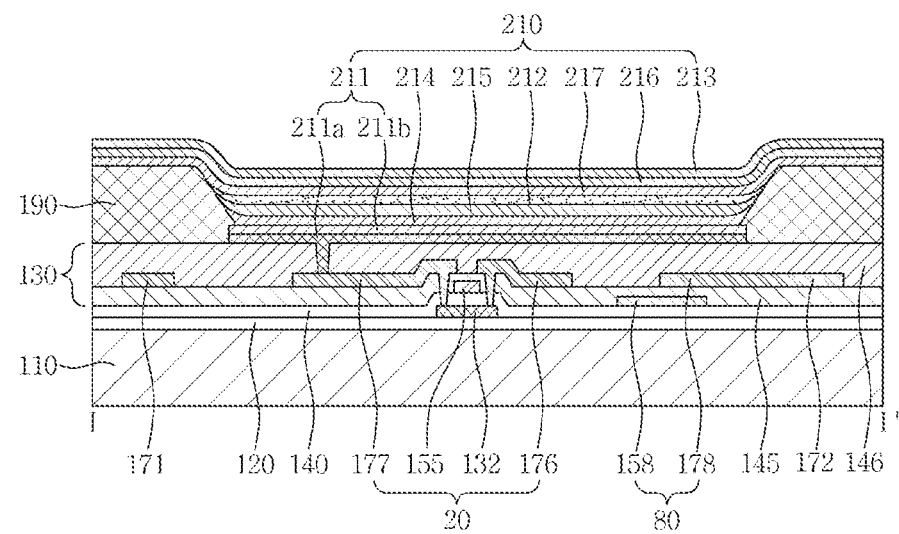

Referring to FIG. 9H, a second electrode 213 is disposed on the electron injection layer 216. An OLED 210 may be formed in the manner described hereinabove.

The second electrode 213 may be formed as a semi-transmissive layer and may have a thickness ranging from about 10 nm to about 20 nm.

Figure 9I:
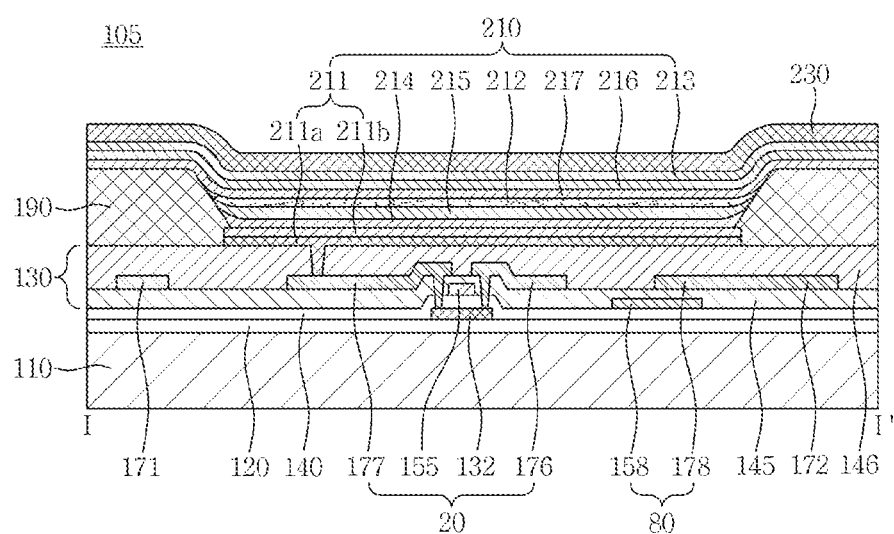

Referring to FIG. 9I, a capping layer 230 is formed on the second electrode 213.

The capping layer 230 protects the OLED 210 and helps a light generated in the organic light emitting layer 212 to be emitted efficiently to the outside.

The capping layer 230 may include at least one of an inorganic material or an organic material having light transmittance. The capping layer 230 may have a thickness ranging from about 30 nm to about 300 nm, and may have a thickness of about 300 nm or more. As the thickness of the capping layer 230 increases, it is more advantageous to protect the OLED 201. However, if the capping layer 230 is thick, it is disadvantageous to slim down the OLED display device 105.

The capping layer 230 may be formed through methods known in the art. The capping layer 230 may be formed by deposition. For example, the capping layer 230 may be formed by deposition of a compound represented by the following Chemical Formula 7, and may have a thickness of about 60 nm.

ultrasonically cleaned and pre-treated (UV-O3 treatment, heat treatment). The first electrode 211 thus manufactured is an anode.

A hole injection layer 214 having a thickness of about 12 nm was formed on the first electrode 211 using a PEDOT/PSS solution. An aqueous solution (with a solvent $H_2O$) including PEDOT in an amount of about 0.5 wt % and PSS in an amount of about 0.8 wt % was used as the PEDOT/PSS solution. A refractive index of the hole injection layer 214 is about 1.5.

A hole transport layer 215 having a thickness of about 5 nm was formed on the hole injection layer 214 using a composition forming a hole transport layer.

The composition forming the hole transport layer is a solution including the compound represented by Chemical Formula 1 in an amount of about 30 wt %, the compound represented by Chemical Formula 2 in an amount of about 12.5 wt %, the compound represented by Chemical Formula 3 in an amount of about 7.5 wt %, and the compound represented by Chemical Formula 4 in an amount of about 50 wt %. According to Test Example 1, the hole transport layer 215 was formed by a solution method.

An organic light emitting layer 212 was formed on the hole transport layer 215. The organic light emitting layer 212 was formed by deposition of a host and a luminescent dopant material. An anthracene derivative compound represented by the following Chemical Formula 8 was used as the host, and a compound represented by the following Chemical Formula 9 was used as the dopant material. The dopant material was used in an amount of about 5 percent by volume (vol %) with respect to the total volume of the deposition material.

According to Test Example 1, the organic light emitting layer 212 has a thickness of about 30 nm.

[Chemical Formula 7]

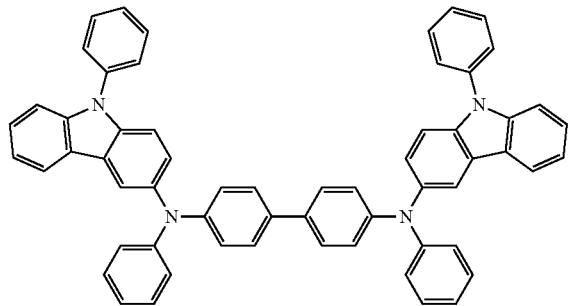

[Chemical Formula 8]

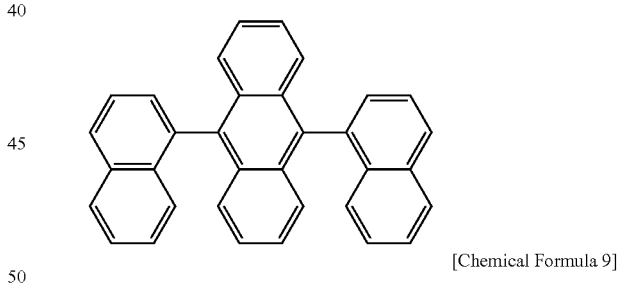

[Chemical Formula 9]

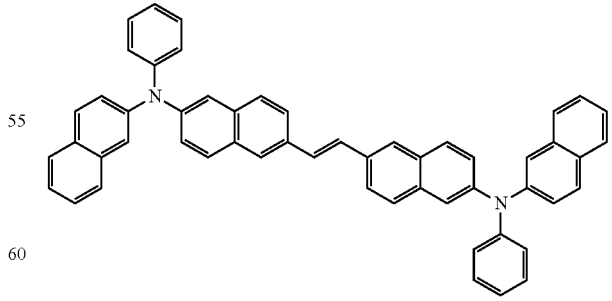

Hereinafter, test examples and comparative examples are described below.

TEST EXAMPLE 1

By sputtering and patterning, a first electrode 211 was formed on a substrate 110 that includes glass, the first electrode 211 including a silver (Ag) layer having a thickness of about 100 nm and an ITO layer having a thickness of about 20 nm that are sequentially stacked. The silver (Ag) layer having a thickness of about 100 nm is a reflective layer 211a, and the ITO layer having a thickness of about 20 nm is a light transmissive conductive layer 211b.

Next, the reflective layer 211a and the light transmissive conductive layer 211b were ultrasonically cleaned using isopropyl alcohol (IPA), cleaned and dried, and further Next, the compound represented by the Chemical Formula 5 was deposited to a thickness of about 20 nm on the organic light emitting layer 212 to form an electron transport layer 217.

Then, lithium quinolate (Liq) was deposited to a thickness of about 0.35 nm on the electron transport layer 217 to form an electron injection layer 216.

Silver (Ag) and magnesium (Mg) were co-deposited (a volume ratio of about 80:20) on the electron injection layer 216 to form a second electrode 213. The second electrode 213 of Test Example 1 has a thickness of about 13 nm.

The second electrode 213 is a semi-transmissive layer and is a cathode.

The compound represented by Chemical Formula 7 was deposited to a thickness of about 60 nm on the second electrode 213 to form a capping layer 230.

When a current was applied at a current density of about 10 mA/cm² to the OLED sample (Test Example 1) prepared in a manner described hereinabove, a driving voltage (V) and a current efficiency (cd/A, luminous efficiency) evaluated. The results are shown in Table 1 below.

TEST EXAMPLE 2

An OLED sample is manufactured in a substantially same manner as in Test Example 1, except that a hole injecting layer 214 was formed to a thickness of about 70 nm, a hole transport layer 215 was formed to a thickness of about 105 nm and an organic light emitting layer 212 was formed to a thickness of about 38 nm.

When a current was applied at a current density of about 10 mA/cm² to the OLED sample (Test Example 2) prepared in such a manner, a driving voltage (V) and a current efficiency (cd/A, luminous efficiency) were evaluated. The results are shown in Table 1 below.

TEST EXAMPLE 3

An OLED sample is manufactured in a substantially same manner as in Test Example 1, except that a hole injection layer 214 having a refractive index of about 1.4 and a thickness of about 12 nm was formed using the composition forming a hole transport layer of Test Example 1 and a hole transport layer 215 having a thickness of about 5 nm was formed thereon. The organic light emitting layer 212 is substantially the same as the organic light emitting layer 212 of Test Example 1, and was formed to have a thickness of about 30 nm.

When a current was applied at a current density of about 10 mA/cm² to the OLED sample (Test Example 3) prepared in such a manner, a driving voltage (V) and a current efficiency (cd/A, luminous efficiency) were evaluated. The results are shown in Table 1 below.

COMPARATIVE EXAMPLE 1

An OLED sample (Comparative Example 1) was manufactured in a substantially same manner as in Test Example 1, except that the compound represented by Chemical Formula 7 was deposited on a first electrode 211 to form a hole injection layer 214 having a thickness of about 5 nm and then a compound represented by the following Chemical Formula 10 was deposited thereon to form a hole transport layer 215 having a thickness of about 5 nm.

[Chemical Formula 10]

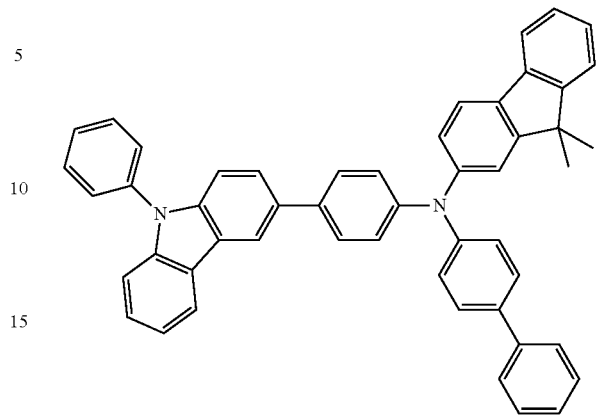

When a current was applied at a current density of about 10 mA/cm² to the OLED sample (Comparative Example 1) prepared in such a manner, a driving voltage (V) and a current efficiency (cd/A, luminous efficiency) were evaluated. The results are shown in Table 1 below.

COMPARATIVE EXAMPLE 2

An OLED sample (Comparative Example 2) was manufactured in a substantially same manner as in Test Example 1, except that the compound represented by Chemical Formula 7 was deposited on a first electrode 211 to form a hole injection layer 214 having a thickness of about 12 nm and then the compound represented by Chemical Formula 10 was deposited thereon to form a hole transport layer 215 having a thickness of about 5 nm.

When a current was applied at a current density of about 10 mA/cm² to the OLED sample (Comparative Example 2) prepared in such a manner, a driving voltage (V) and a current efficiency (cd/A, luminous efficiency) were evaluated. The results are shown in Table 1 below.

TABLE 1

| | HIL/HTL | | |
| --- | --- | --- | --- |
| Method | Refractive index (n) | Driving voltage (V) | Luminous efficiency (cd/A) |
| Test Example 1 Solution Method(Wet) | 1.5 | 4.6 | 5.5 |
| Test Example 2 Solution Method(Wet) | 1.5 | 4.8 | 5.4 |
| Test Example 3 Solution Method(Wet) | 1.4 | 4.4 | 5.6 |
| Comparative Example 1 Deposition(Dry) | 1.6 | (short) | (short) |
| Comparative Example 2 Deposition(Dry) | 1.6 | 5.2 | 5.4 |

Referring to Table 1, in the case where the hole injection layer and the hole transport layer having a small thickness are formed by deposition, a short circuit occurs (Comparative Example 1). In addition, in the case where a hole injection layer and a hole transport layer having a large thickness are formed by deposition, a driving voltage increases (Comparative Example 2).

On the other hand, in the case where the hole transport layer is formed by the solution method (Test Examples 1, 2 and 3), a short circuit does not occur in the OLED, and the OLED is driven at a relatively low voltage and has high efficiency. In the case where the hole transport layer is formed by the solution method, such an effect may be achieved because the hole transport layer may cover a surface of the first electrode, for example, unevenness and foreign substances on a surface of the ITO layer.

In addition, according to Test Examples 1, 2 and 3, since the refractive indices of the hole injection layer and the hole transport layer are as small as about 1.6 or less, the optical distance for the primary resonance may be ensured even though the thickness of the hole injection layer and the hole transport layer is large.

Thus, according to exemplary embodiments, an OLED display device having a relatively low driving voltage, a long lifetime and high efficiency may be manufactured.

As set forth hereinabove, according to one or more exemplary embodiments, the OLED display device may be manufactured using both the solution method and the deposition method. The OLED display device according to an exemplary embodiment may have excellent luminous efficiency and a long lifetime.

While the inventive concept has been illustrated and described with reference to the exemplary embodiments thereof, it will be apparent to those of ordinary skill in the art that various changes in form and detail may be made thereto without departing from the spirit and scope of the inventive concept.

What is claimed is:

1. An organic light emitting diode display device comprising:
a substrate;
a first electrode on the substrate;
a hole transport layer on the first electrode;
an organic light emitting layer on the hole transport layer; and
a second electrode on the organic light emitting layer,
wherein the hole transport layer comprises a hole transport layer composition comprising a compound represented by the following Chemical Formula 1, a compound represented by the following Chemical Formula 2, a compound represented by the following Chemical Formula 3, and a compound represented by the following Chemical Formula 4:

[Chemical Formula 1]

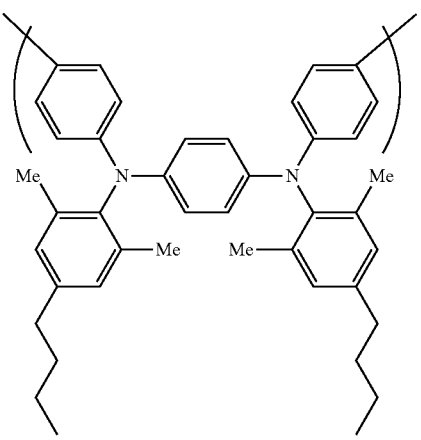

[Chemical Formula 2]

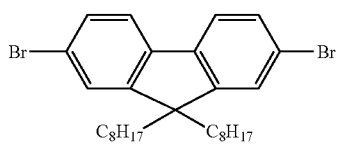

[Chemical Formula 3]

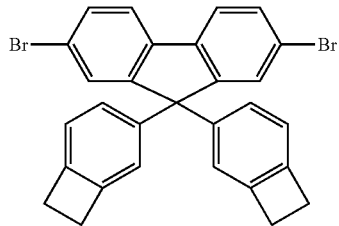

[Chemical Formula 4]

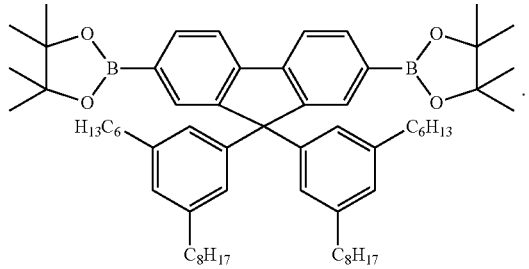

2. The organic light emitting diode display device as claimed in claim 1, wherein the hole transport layer is formed by coating and curing the hole transport layer composition.

3. The organic light emitting diode display device as claimed in claim 1, wherein the hole transport layer composition comprises the compound represented by Chemical Formula 1 in an amount ranging from about 25 percent by weight (wt %) to about 35 wt %, the compound represented by Chemical Formula 2 in an amount ranging from about 10 wt % to about 15 wt %, the compound represented by Chemical Formula 3 in an amount ranging from about 5 wt % to about 10 wt %, and the compound represented by Chemical Formula 4 in an amount ranging from about 40 wt % to about 60 wt %.

4. The organic light emitting diode display device as claimed in claim 1, wherein the hole transport layer has a refractive index of about 1.6 or less.

5. The organic light emitting diode display device as claimed in claim 1, wherein the hole transport layer has a thickness ranging from about 5 nm to about 10 nm.

6. The organic light emitting diode display device as claimed in claim 1, wherein the hole transport layer has a thickness ranging from about 100 nm to about 110 nm.

7. The organic light emitting diode display device as claimed in claim 1, wherein the organic light emitting layer is formed by depositing an organic light emitting material.

8. The organic light emitting diode display device as claimed in claim 1, further comprising a hole injection layer between the first electrode and the hole transport layer.

9. The organic light emitting diode display device as claimed in claim 8, wherein the hole injection layer is formed by coating and curing a solution comprising a hole injecting material.

10. The organic light emitting diode display device as claimed in claim 8, wherein the hole injection layer has a refractive index of about 1.6 or less.

11. The organic light emitting diode display device as claimed in claim 1, further comprising an electron transport layer between the organic light emitting layer and the second electrode.

12. The organic light emitting diode display device as claimed in claim 1, wherein the first electrode comprises a reflective layer and a light transmissive conductive layer on the reflective layer, and the following Equation 2 is satisfied when an optical distance between a surface of the reflective layer opposing the second electrode and a surface of the second electrode opposing the reflective layer is L1 and a peak wavelength of a light generated in the organic emitting layer is $\lambda 1$, $$L1 = [(2m+1)/4] \times \lambda 1, \quad \text{[Equation 2]}$$

wherein m is an integer greater than or equal to zero.

\* \* \* \* \*